(12) United States Patent
Behringer

(10) Patent No.: US 6,832,021 B2
(45) Date of Patent: Dec. 14, 2004

(54) CONFIGURATION FOR COUPLING RADIATION INTO AN OPTICAL FIBER

(75) Inventor: Martin Behringer, Regensburg (DE)

(73) Assignee: OSRAM Opto-Semiconductors GmbH, Regensburg (DE)

( * ) Notice: Subject to any disclaimer, the term of this patent is extended or adjusted under 35 U.S.C. 154(b) by 123 days.

(21) Appl. No.: 10/353,464

(22) Filed: Jan. 29, 2003

(65) Prior Publication Data

US 2003/0142910 A1 Jul. 31, 2003

(30) Foreign Application Priority Data

Jan. 29, 2002 (DE) .......................................... 102 03 392

(51) Int. Cl.⁷ ................................................ G02B 6/42
(52) U.S. Cl. ............................. 385/31; 385/33; 385/37; 385/90
(58) Field of Search ............................. 385/31, 33, 37, 385/88, 90, 93; 372/6, 50, 92, 102, 108; 257/98; 359/341, 345

(56) References Cited

U.S. PATENT DOCUMENTS

| 4,604,637 A | * | 8/1986 | Ruhle et al. ............... 257/98 X |
| 4,877,300 A | | 10/1989 | Newhouse et al. ........... 385/43 |
| 5,508,842 A | | 4/1996 | Takeda et al. .............. 359/341 |
| 5,864,645 A | | 1/1999 | Zellmer et al. ............. 385/126 |
| 6,728,285 B2 | * | 4/2004 | Hayakawa .................... 372/92 |
| 2004/0033022 A1 | * | 2/2004 | Althaus et al. ............... 385/37 |

FOREIGN PATENT DOCUMENTS

| DE | 37 05 408 C1 | 8/1988 |
| DE | 689 20 270 T2 | 5/1990 |
| DE | 42 38 434 A1 | 10/1993 |
| DE | 195 35 526 C1 | 4/1997 |
| DE | 196 28 068 A1 | 6/1997 |
| DE | 100 09 379 A1 | 9/2001 |

* cited by examiner

Primary Examiner—Phan T. H. Palmer
(74) Attorney, Agent, or Firm—Laurence A. Greenberg; Werner H. Stemer; Ralph E. Locher

(57) ABSTRACT

A compactly constructed configuration for coupling radiation into an optical fiber in a highly effective manner has a semiconductor laser with a radiation exit window, and an optical fiber having a radiation entry end. The radiation exit window of the semiconductor laser faces the radiation entry end of the optical fiber. A resonator is provided and has an end mirror and an output mirror, between which the semiconductor laser is disposed. The output mirror of the resonator is formed by the optical fiber. An optical device is disposed between the semiconductor laser and the optical fiber and serves for imaging only the fundamental mode of the radiation of the semiconductor laser onto the radiation entry end of the optical fiber.

9 Claims, 1 Drawing Sheet

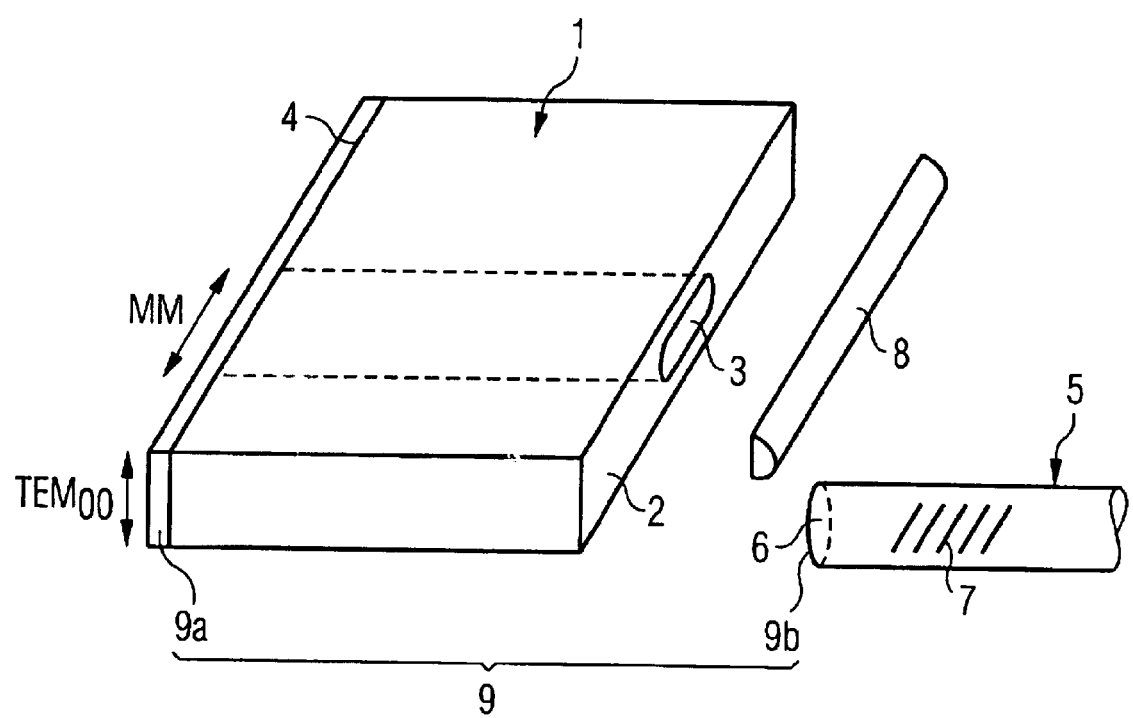

CONFIGURATION FOR COUPLING RADIATION INTO AN OPTICAL FIBER

BACKGROUND OF THE INVENTION

Field of the Invention

The present invention relates to a configuration for coupling radiation into an optical fiber. The configuration contains a semiconductor laser having a radiation exit window, and an optical fiber having a radiation entry end. The radiation exit window of the semiconductor laser faces the radiation entry end of the optical fiber. A resonator is provided and has an end mirror and an output mirror, between which the semiconductor laser is disposed. An optical device is disposed between the semiconductor laser and the optical fiber and serves for imaging only the fundamental mode of the radiation of the semiconductor laser onto the radiation entry end of the optical fiber.

In the present context, the term "end mirror" relates to a resonator mirror which is of a highly reflective configuration and reflects radiation that is generated in the semiconductor laser and impinges on it back into the semiconductor laser as far as possible completely or with the exception of a slight residue, which can be utilized for laser monitoring, for example. In the present context, the term "output mirror" relates to a resonator mirror which is of a partly reflective configuration such that a part of the radiation that impinges on it, which part is provided for engendering and maintaining laser activity, is reflected back into the semiconductor laser and a residue of the radiation is output from the semiconductor laser configuration.

In particular in applications which require a particularly high radiation power, such as, for example, in communications technology, as a pump laser or for materials processing (welding, soldering and the like), it is necessary to couple the radiation emitted by a semiconductor laser into an associated optical fiber as far as possible without radiation losses and with a high intensity. Therefore, the use of the fundamental mode is usually required in such applications on account of its intensity distribution and its better focusability.

The prior art has already disclosed various configurations and devices for efficiently coupling radiation into optical fibers.

Thus, by way of example, German Patent DE 37 05 408 C1 discloses a device for optically coupling a laser to an optical waveguide, between which an optical collimator is disposed and which are all disposed in corresponding receptacles in a housing. In this case, the receptacles of the laser and of the collimator are constructed in such a way that the laser can be displaced laterally with respect to the main beam propagation direction and the collimator can be displaced along the main beam propagation direction, so that a low-loss coupling of the radiation emitted by the laser into the optical waveguide can be set despite manufacturing and mounting tolerances.

A further configuration for efficiently coupling radiation into an optical waveguide is disclosed in European Patent EP 0 366 320 B1, corresponding to U.S. Pat. No. 4,877,300. In this case, a so-called mode field modifier is provided between a light source and an optical waveguide or between two optical waveguides. The mode field modifier essentially contains an expanded fiber piece with specially chosen refractive indices of core and cladding of the optical waveguide in the expanded fiber piece in order to achieve a beam expansion that is as large as possible. In this way, the coupling-in becomes less sensitive to a lateral misalignment of the components.

Furthermore, German Patent DE 195 35 526 C1 (corresponding to U.S. Pat. No. 5,864,645) and U.S. Pat. No. 5,508,842 disclose two different constructions of optical fiber amplifiers which in each case have an efficiency that is as high as possible. In the case of DE 195 35 526 C1 this is achieved by as far as possible complete absorption of the pump light in the laser core of the double-core fiber by the pump core which surrounds the laser core being partly ground away or chamfered away, so that as far as possible the entire pump light is directed onto the laser core. In the case of the optical fiber amplifier of U.S. Pat. No. 5,508,842, by contrast, the fiber core is tapered in the direction of propagation of the pump light, so that, despite the attenuation of the pump light with the propagation thereof, a maximum proportion of the pump light always contributes to the amplification of the signal light.

While the above-described configurations are concerned with the object of efficient, i.e. low-loss coupling of radiation into an optical fiber, Published, Non-Prosecuted German Patent Application DE 100 09 379 A1, for example, describes an optical fiber amplifier that amplifies essentially only the fundamental mode of the signal radiation. For this purpose, the fiber amplifier has a central active laser core and a pump core surrounding the latter within a fiber cladding, thereby forming a so-called double-core fiber. An element for transverse mode selection is additionally provided in order to amplify essentially only the fundamental mode and to suppress higher modes than the fundamental mode. This element is configured for example as adiabatic tapering of the fiber or as a so-called mode scrambler.

Furthermore, Published, Non-Prosecuted German Patent Application DE 196 28 068 A1 discloses a laser with a so-called fundamental mode determinator in order to emit only light in the transverse fundamental mode and to mask out other modes. The fundamental mode determinator, which essentially contains two screens, is disposed together with the active laser material between the two resonator mirrors.

The above-described conventional configurations for efficiently coupling radiation into an optical fiber all exhibit a relatively complicated construction of either the laser configuration, the optical fiber or the coupling-in system. Therefore, there is a need for a configuration that is as simple and compact as possible and nevertheless enables highly efficient coupling-in of radiation.

For this purpose, a configuration has already been developed, as is described in Published, Non-Prosecuted German Patent Application DE 42 38 434 A1.

Published, Non-Prosecuted German Patent Application DE 42 38 434 A1 discloses a configuration for focusing and coupling the radiation generated by a semiconductor laser into a multimode optical fiber. A radiation-focusing element in the form of a cylindrical lens is disposed between the radiation exit side of the semiconductor laser and the radiation entry side of the optical fiber. In this case, the longitudinal axis of the cylindrical lens is oriented essentially parallel to the multimode direction of the radiation emitted by the semiconductor laser in order that only the fundamental mode of the radiation of the semiconductor laser is imaged onto the radiation entry side of the optical fiber. In order to achieve a simplified assembly, the cylindrical lens is adhesively bonded directly onto the radiation entry side of the optical fiber or is melted together with it or is melted onto the latter.

SUMMARY OF THE INVENTION

It is accordingly an object of the invention to provide a configuration for coupling radiation into an optical fiber that overcomes the above-mentioned disadvantages of the prior art devices of this general type, in which the coupling-in of radiation is as efficient as possible and is ensured despite a more compact construction.

With the foregoing and other objects in view there is provided, in accordance with the invention, a configuration for coupling radiation. The configuration contains a semiconductor laser having a radiation exit window formed therein, and an optical fiber having a radiation entry end. The radiation exit window of the semiconductor laser faces the radiation entry end of the optical fiber. A resonator is provided and has an end mirror and an output mirror. The semiconductor laser is disposed between the end mirror and the output mirror, and the output mirror is formed in or at the optical fiber. An optical device is disposed between the semiconductor laser and the optical fiber and serves for imaging only a fundamental mode of the radiation of the semiconductor laser onto the radiation entry end of the optical fiber.

By virtue of the construction according to the invention, on the one hand, the fundamental mode is coupled in with preference over higher modes, and, on the other hand, the coupling of the radiation into an optical fiber and the resonator of the semiconductor laser are linked to one another, which leads to the compact and at the same time efficient configuration of the arrangement according to the invention.

In a preferred exemplary embodiment of the invention, the radiation entry end of the optical fiber is formed and/or coated in such a way that it forms the output mirror of the resonator and at the same time enables the radiation of the semiconductor laser to be coupled into the optical fiber. In this case, it should be taken into consideration that the radiation entry end of the optical fiber on the one hand serves as a resonator, i.e. is configured to be reflective, but on the other hand the non-reflected radiation is intended to be coupled into the optical fiber.

In an alternative preferred exemplary embodiment of the invention, a Bragg mirror grating, which forms the output mirror of the resonator, is provided in the optical fiber in the vicinity of the radiation entry side.

The end mirror of the resonator is preferably formed by the side area of the semiconductor laser remote from the radiation exit window, which side area is configured to be highly reflective.

A further advantageous refinement of the invention consists in the fact that the side area of the semiconductor laser having the radiation exit window is essentially antireflection-coated, i.e. has a residual reflectivity of preferably less than or equal to $10^{-3}$.

In accordance with a preferred development of the invention, the optical device has a cylindrical lens whose longitudinal axis is disposed essentially parallel to the multimode direction and perpendicular to the fundamental mode direction of the radiation emitted by the semiconductor laser.

Proceeding further, it is possible to provide, in addition to the cylindrical lens, a further optical element such as a lens, for example, which optical element compensates for the curvature of the phase front of the fundamental mode.

In a particularly advantageous manner, the optical fiber is an optical fiber amplifier for amplifying the radiation coupled in through the radiation entry end, which may be configured in particular as a double-core fiber.

In a further variant of the invention, the optical fiber used is a frequency-converting fiber that, by way of example, effects a doubling of the frequency of the coupled-in radiation.

Other features which are considered as characteristic for the invention are set forth in the appended claims.

Although the invention is illustrated and described herein as embodied in a configuration for coupling radiation into an optical fiber, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, perspective view of an exemplary embodiment of a configuration for coupling radiation from a semiconductor laser into an optical fiber according to the invention.

DESCRIPTION OF THE PREFERRED EMBODIMENTS

Referring now to the single FIGURE of the drawing in detail, there is shown diagrammatically, a configuration according to the invention that contains a semiconductor laser 1, an optical fiber 5, a resonator 9 and an optical device 8. The semiconductor laser 1 has a radiation exit window 3, a side area 2 of the semiconductor laser having the radiation exit window 3 being antireflection-coated to a very great extent at least in the region of the radiation exit window 3 in order to permit the exit of radiation. By way of example, the side area 2 of the semiconductor laser 1 is coated for this purpose in such a way that its residual reflectivity is less than $10^{-3}$.

A second side area 4 of the semiconductor laser 1 remote from the radiation exit window 3 is configured to be highly reflective. Consequently, the second side area 4 serves, in a manner known per se, as an end mirror or first resonator mirror 9a of a resonator 9 of the configuration.

While the semiconductor laser 1 illustrated in the FIGURE is constructed as a so-called edge emitter, the invention is not restricted to this construction. Rather, semiconductor lasers configured as surface emitters can also be used, by way of example. Moreover, the present invention is not restricted to specific semiconductor lasers; by way of example, it is possible to use a semiconductor laser of the material system AlGaInAs.

The optical fiber 5 is disposed on the side of the radiation exit window 3 of the semiconductor laser 1. The optical fiber 5 has a radiation entry end 6 that faces the radiation exit window 3 of the semiconductor laser 1.

The radiation entry end 6 of the optical fiber 5 can at the same time serve as a output mirror or second resonator mirror 9b of the resonator 9 of the configuration. For this purpose, the radiation entry end 6 of the optical fiber 5 is coated and/or formed in such a way that a part of the radiation emitted by the semiconductor laser 1 through the radiation exit window 3 is reflected in order to form the resonator 9 together with the side area 4 of the semiconductor laser 1 coated in a highly reflective manner. At the same time, the radiation entry end 6 of the optical fiber 5 must be coated and/or formed in such a way that the non-reflected part of the radiation couples into the optical fiber 5.

As an alternative or possibly also in addition to the coating of the radiation entry area 6 of the optical fiber 5, a Bragg radiation grating 7 may also be implemented in the optical fiber 5 in the vicinity of the radiation entry end 6, which grating 7, as a second resonator mirror 9b, forms the resonator 9 of the configuration together with the highly reflective side area 4 as a first resonator mirror 9a, as is indicated diagrammatically in the FIGURE.

Moreover, the optical fiber 5 may be configured both as a customary optical fiber for transmitting the coupled-in radiation and as an optical fiber amplifier for amplifying the signal radiation. In the last-mentioned case, the optical fiber 5 is configured for example as a double-core fiber with an inner laser core and a pump core surrounding the latter, as has already been disclosed in the prior art.

Furthermore, both single-mode and multimode optical fibers can be used for the configuration according to the invention, even if essentially only the fundamental mode of the signal radiation is coupled into the optical fiber on the basis of the arrangement configured according to the invention.

If a frequency conversion of the radiation is desired, it is also possible to use a frequency-converting, for example frequency-doubling, optical fiber. Such an optical fiber preferably contains, in a targeted manner, a nonlinear optical material that serves for frequency conversion. Moreover, the fiber itself can be produced from such a nonlinear optical material.

An optical device 8, containing one or more optical elements, such as, for example, lenses, gratings and the like, is additionally provided between the optical fiber 5 and the semiconductor laser 1. The optical device 8 is configured and disposed in such a way that a curvature of a phase front of only a fundamental mode $TEM_{00}$ of the radiation emitted by the semiconductor laser 1 is compensated for and only the fundamental mode $TEM_{00}$ is imaged onto the radiation entry end 6 of the optical fiber 5. Modes higher than the fundamental mode are not imaged onto the radiation entry end 6 of the optical fiber 5 or they are suppressed.

As already proposed in Published, Non-Prosecuted German Patent Application DE 42 38 434 A1, for this purpose the optical device 8 may have a cylindrical lens whose longitudinal axis is oriented essentially parallel to a multimode direction (arrow MM) and perpendicular to the fundamental mode direction (arrow $TEM_{00}$ in the FIGURE) of the radiation emitted by the semiconductor laser 1. In addition, the cylindrical lens 8 can also be fitted directly at the radiation entry end 6 of the optical fiber 5 and be dimensioned in the manner disclosed in DE 42 38 434 A1.

The restriction to the fundamental mode $TEM_{00}$ of the radiation emitted by the semiconductor laser 1 enables the radiation to be coupled into the optical fiber 5 more efficiently. The use of the optical fiber 5 as second resonator mirror of the resonator 9 furthermore enables a highly compact configuration of the arrangement without impairing the efficiency of the coupling-in of radiation.

A further advantage of the arrangement according to the invention is that the radiation losses of customary partly mirror-coated output mirrors of the resonator of the semiconductor laser are automatically coupled into the optical fiber and are therefore not lost. This further increases the efficiency of the configuration.

I claim:

1. A configuration for coupling radiation, the configuration comprising:
   a semiconductor laser having a radiation exit window formed therein;
   an optical fiber having a radiation entry end, said radiation exit window of said semiconductor laser facing said radiation entry end of said optical fiber;
   a resonator having an end mirror and an output mirror, said semiconductor laser disposed between said end mirror and said output mirror, said output mirror formed in or at said optical fiber; and
   an optical device disposed between said semiconductor laser and said optical fiber and serving for imaging only a fundamental mode of the radiation of said semiconductor laser onto said radiation entry end of said optical fiber.

2. The configuration according to claim 1, wherein said radiation entry end of said optical fiber is at least one of formed and coated in such a way that said radiation entry end forms said output mirror of said resonator and enables the radiation of said semiconductor laser to be coupled in.

3. The configuration according claim 1, wherein said optical fiber at said radiation entry end has a Bragg mirror grating forming said output mirror of said resonator.

4. The configuration according to claim 1, wherein said semiconductor laser has a side area configured to be highly reflective and remote from said radiation exit window, said side area forms said end mirror of said resonator.

5. The configuration according to claim 4, wherein said semiconductor laser has a further side area containing said radiation exit window, one of said radiation exit window and said further side area having an antireflection-coating.

6. The configuration according to claim 5, wherein said radiation exit window has a residual reflectivity of less than or equal to $10^{-3}$.

7. The configuration according to claim 1, wherein said optical device has a cylindrical lens with a longitudinal axis disposed substantially parallel to a multimode direction of the radiation emitted by said semiconductor laser.

8. The configuration according to claim 1, wherein said optical fiber is an optical fiber amplifier for amplifying the radiation coupled in through said radiation entry end.

9. The configuration according to claim 1, wherein said optical device compensates for a curvature of a phase front of a fundamental mode.

* * * * *